(12) United States Patent
Wang et al.

(10) Patent No.: US 10,153,239 B2
(45) Date of Patent: Dec. 11, 2018

(54) ANTENNAS AND WAVEGUIDES IN INFO STRUCTURES

(71) Applicant: Taiwan Semiconductor Manufacturing Company, Ltd., Hsinchu (TW)

(72) Inventors: Chuei-Tang Wang, Taichung (TW); Chung-Hao Tsai, Huatan Township (TW); Chen-Hua Yu, Hsinchu (TW); Jeng-Shien Hsieh, Kaohsiung (TW); Wei-Heng Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/669,251

(22) Filed: Aug. 4, 2017

(65) Prior Publication Data
US 2017/0338195 A1 Nov. 23, 2017

Related U.S. Application Data

(62) Division of application No. 14/959,313, filed on Dec. 4, 2015, now Pat. No. 9,735,118.

(51) Int. Cl.
| | |
|---|---|
| H01L 23/31 | (2006.01) |
| H01L 23/66 | (2006.01) |
| H01L 23/00 | (2006.01) |
| H01L 21/768 | (2006.01) |
| H01L 21/56 | (2006.01) |

(52) U.S. Cl.
CPC .............. *H01L 23/66* (2013.01); *H01L 21/56* (2013.01); *H01L 23/3114* (2013.01); *H01L 23/3128* (2013.01); *H01L 24/19* (2013.01); *H01L 21/568* (2013.01); *H01L 21/76898* (2013.01); *H01L 2223/6627* (2013.01); *H01L 2223/6677* (2013.01); *H01L 2224/04105* (2013.01); *H01L 2224/12105* (2013.01); *H01L 2224/19* (2013.01); *H01L 2224/32225* (2013.01);

(Continued)

(58) Field of Classification Search
USPC ........................................................ 257/695
See application file for complete search history.

(56) References Cited

U.S. PATENT DOCUMENTS 8,361,842 B2    1/2013   Yu et al.
8,390,128 B2 *  3/2013   Nam ................. H01L 23/49833
                                                257/774

(Continued)

*Primary Examiner* — Chandra Chaudhari
(74) *Attorney, Agent, or Firm* — Slater Matsil, LLP

(57) ABSTRACT

A method includes forming a first metal plate, forming a metal ring aligned to peripheral regions of the first metal plate, and placing a device die level with the metal ring, encapsulating the device die and the metal ring in an encapsulating material. The method further includes filling a dielectric material into a space encircled by the metal ring, and forming a second metal plate covering the dielectric material and the metal ring, with an opening formed in the second metal plate. A plurality of redistribution lines is formed, with one of the redistribution lines overlapping a portion of the opening. The first metal plate, the metal ring, the second metal plate, and the dielectric material in combination form an antenna or a waveguide. The redistribution line forms a signal-coupling line of the passive device.

20 Claims, 35 Drawing Sheets

(52) U.S. Cl.
CPC ............... *H01L 2224/73267* (2013.01); *H01L 2224/92244* (2013.01)

(56) References Cited

U.S. PATENT DOCUMENTS

| | | |
|---|---|---|
| 8,450,856 B2 | 5/2013 | Kang et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,000,589 B2 * | 4/2015 | Koey ................ H01L 23/3128 257/738 |
| 9,111,870 B2 | 8/2015 | Vincent |
| 9,337,073 B2 | 5/2016 | Liu et al. |
| 9,343,434 B2 * | 5/2016 | Chen .................... H01L 23/481 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

\* cited by examiner

ANTENNAS AND WAVEGUIDES IN INFO STRUCTURES

CROSS-REFERENCE TO RELATED APPLICATIONS

This application is a divisional of U.S. application Ser. No. 14/959,313, entitled "Antennas and Waveguides in InFO Structures," filed on Dec. 4, 2015, which application is hereby incorporated herein by reference.

BACKGROUND

Passive devices such as inductors, transformers, antennas, transmission lines, waveguides, or the like are commonly used in Radio Frequency (RF) applications. The passive devices may be embedded in System-on-Chip (SoC) applications. The performance of the passive devices, such as the Q factors, however, is low due to the Eddy currents generated in the nearby silicon substrates. The passive devices may also be formed on glass substrates, or in the fan-out structures of device dies when the device dies are packaged. The results, however, are still not satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
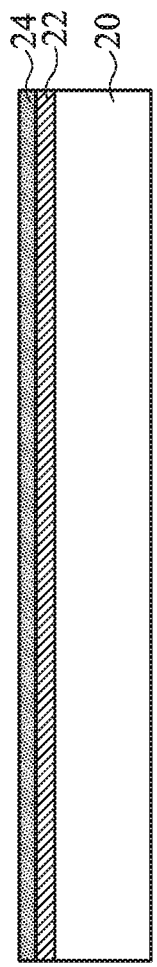
FIGS. 1 through 16 illustrate the cross-sectional views of intermediate stages in the formation of a package including an antenna or a waveguide in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages including antennas or waveguides and the methods of forming the same are provided in accordance with various exemplary embodiments. The intermediate stages of forming the packages are illustrated. The variations of some of the embodiments are discussed. Throughout the various views and illustrative embodiments, like reference numbers are used to designate like elements.

Figure 35:
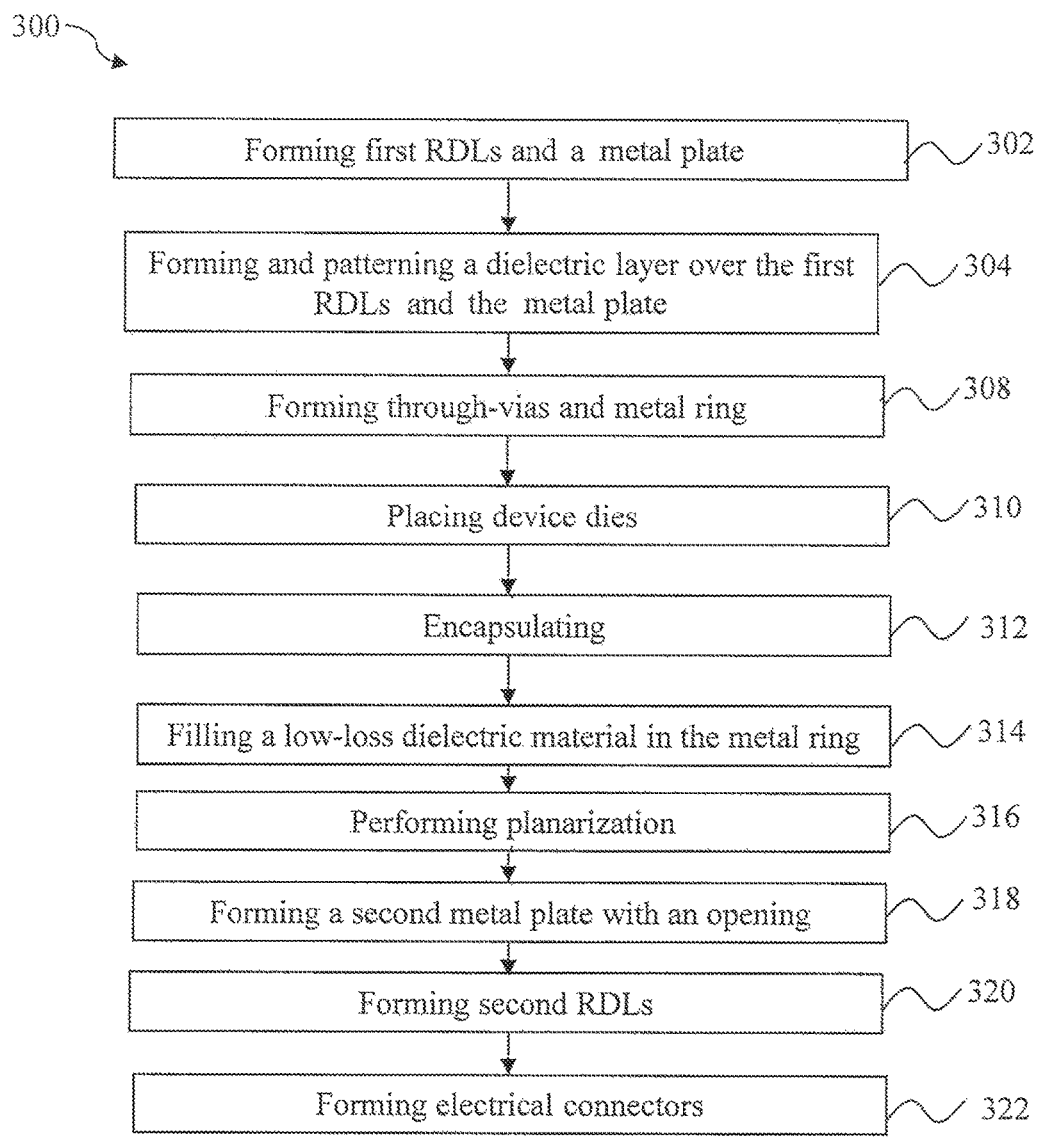
FIG. 35 illustrates a process flow in accordance with some embodiments.

FIGS. 1 through 16 illustrate the cross-sectional views of intermediate stages in the formation of an antenna (or a waveguide) in an Integrated Fan-Out (InFO) structure in accordance with some embodiments. The steps shown in FIGS. 1 through 16 are also illustrated schematically in the process flow 300 shown in FIG. 35. In the subsequent discussion, the process steps shown in FIGS. 1 through 16 are discussed referring to the process steps in FIG. 35.

FIG. 1 illustrates carrier 20 and release layer 22 formed on carrier 20. Carrier 20 may be a glass carrier, a ceramic carrier, or the like. Carrier 20 may have a round top-view shape and may be a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. Release layer 22 may be dispensed as a liquid and cured. In accordance with alternative embodiments, release layer 22 is a laminate film and is laminated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be patterned through light exposure and development. In accordance with alternative embodiments, dielectric layer 24 is formed of a nitride such as silicon nitride, an oxide such as silicon oxide, PhosphoSilicate Glass (PSG), Boro-Silicate Glass (BSG), Boron-doped PhosphoSilicate Glass (BPSG), or the like.

Figure 2:
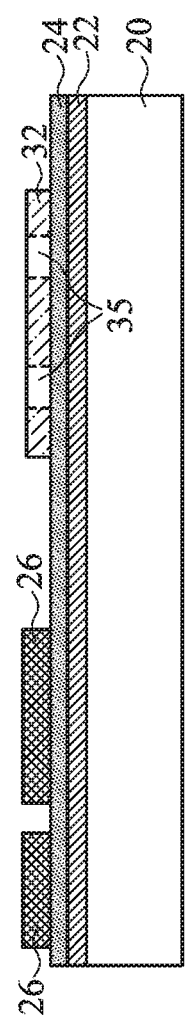
Figure 16:
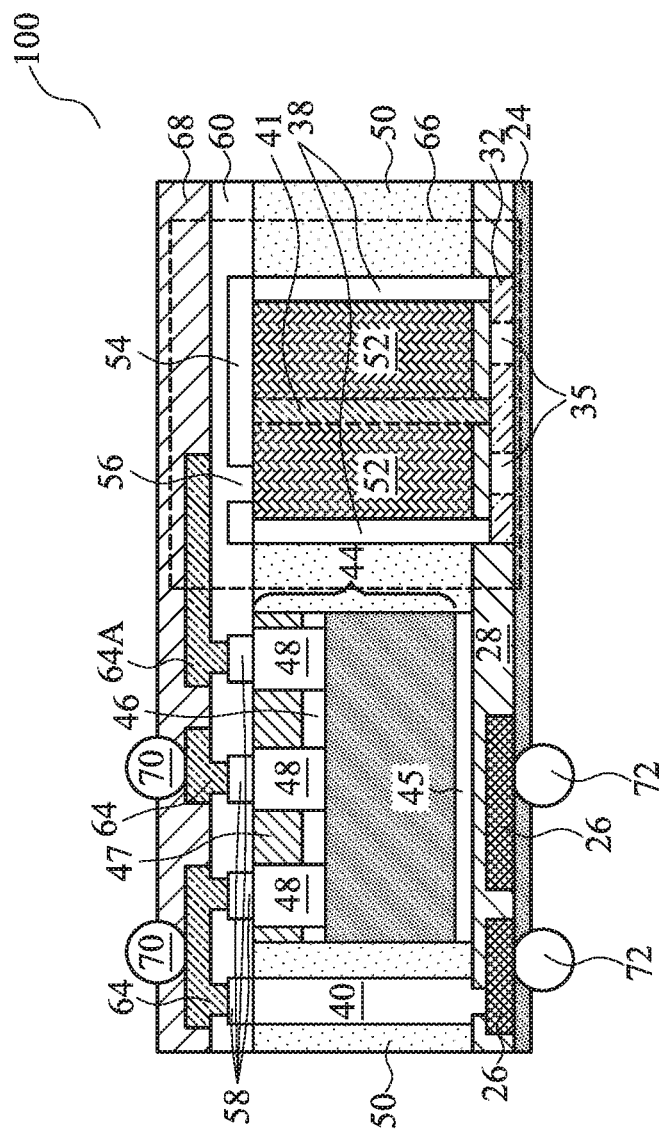

Referring to FIG. 2, Redistribution Lines (RDLs) 26 are formed over dielectric layer 24. The respective step is shown as step 302 in the process shown in FIG. 35. RDLs 26 are also referred to as backside RDLs since they are located on the backside of device die 44 (FIG. 16). The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 2. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Figure 22A:
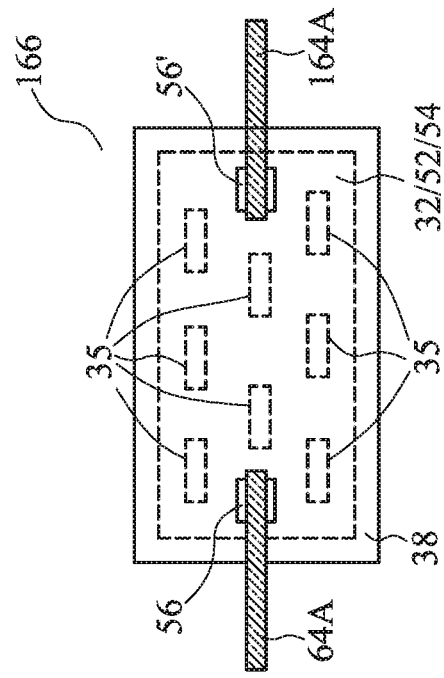
FIGS. 22A and 22B illustrate top views of an antenna and a waveguide, respectively, in accordance with some embodiments
Figure 22B:
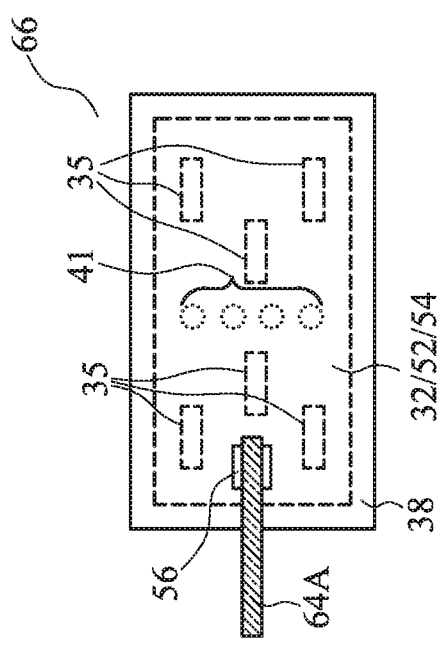

At the same time RDLs 26 are formed, metal plate 32 is formed simultaneously. Metal plate 32 may be a solid plate with no opening therein, or may include one or a plurality of through-openings 35, which are shown using dashed lines to indicate openings 35 may or may not be formed. Exemplary layouts of through-openings 35 are shown in FIGS. 22A and 22B.

Figure 3:
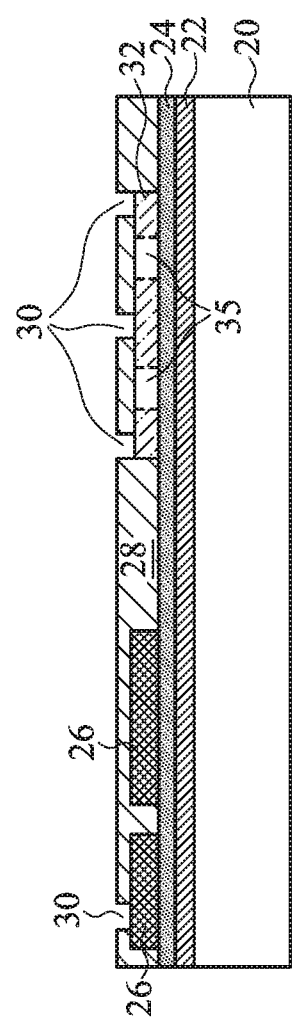

Referring to FIG. 3, dielectric layer 28 is formed on RDLs 26 and metal pad 32. The respective step is shown as step 34 in the process shown in FIG. 35. The bottom surface of dielectric layer 28 is in contact with the top surfaces of RDLs 26, metal pad 32, and dielectric layer 24. In accordance with some embodiments of the present disclosure, dielectric layer 28 is formed of a polymer, which may be a photo-sensitive material such as PBO, polyimide, BCB, or the like. In accordance with alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Although there is one opening 30 shown in the illustrated plane, there may be a plurality of openings 30 formed simultaneously. Some portions of RDLs 26 and metal pad 32 are exposed through openings 30 in dielectric layer 28.

Figure 4:
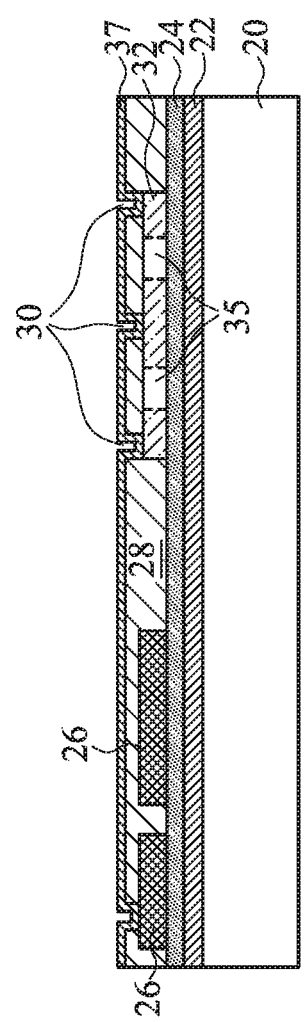

Referring to FIG. 4, seed layer 37 is formed over dielectric layer 28, for example, through Physical Vapor Deposition (PVD) or metal foil lamination. Seed layer 37 may include copper, aluminum, titanium, or multi-layers thereof. In accordance with some embodiments, seed layer 37 includes a titanium layer (not shown) and a copper layer (not shown) over the titanium layer. In accordance with alternative embodiments, seed layer 37 includes a single copper layer. When openings 35 are formed, seed layer will also extend into openings 35.

Figure 5:
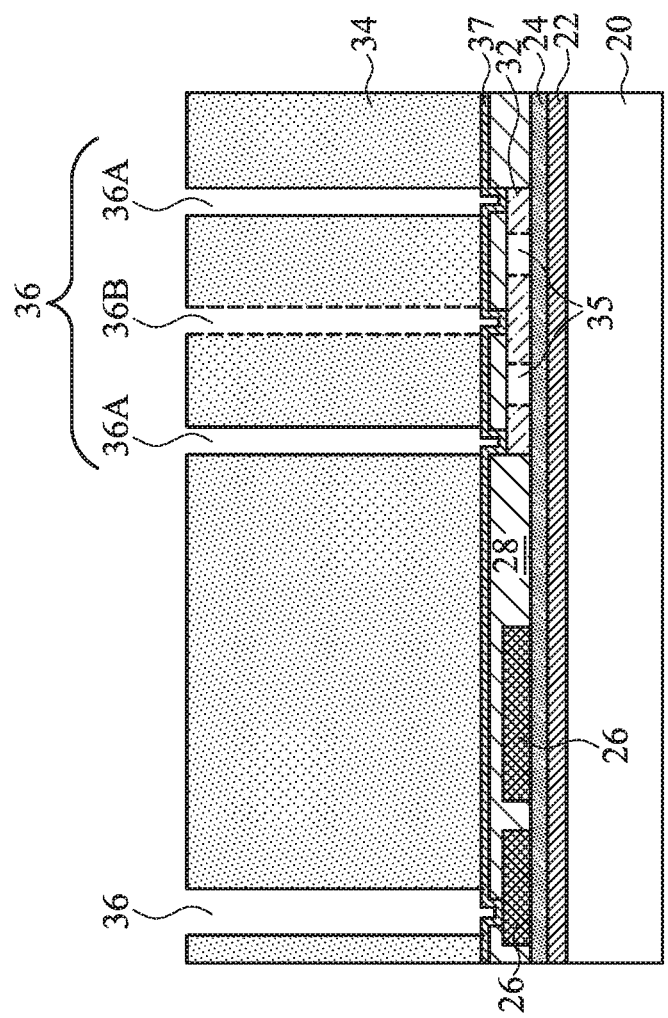

Referring to FIG. 5, in accordance with some embodiments, photo resist 34 is applied over seed layer 37 and is then patterned. As a result, openings 36 (including 36A and 36B) are formed in photo resist 34, and some portions of seed layer 37 are exposed. Openings 36A, when viewed from the top of the illustrated structure, form a full ring, and may have a rectangular shape. The peripheral regions of metal plate 32 are exposed through openings 36A. Opening 36B may be a discrete opening isolated from openings 36A.

Figure 6:
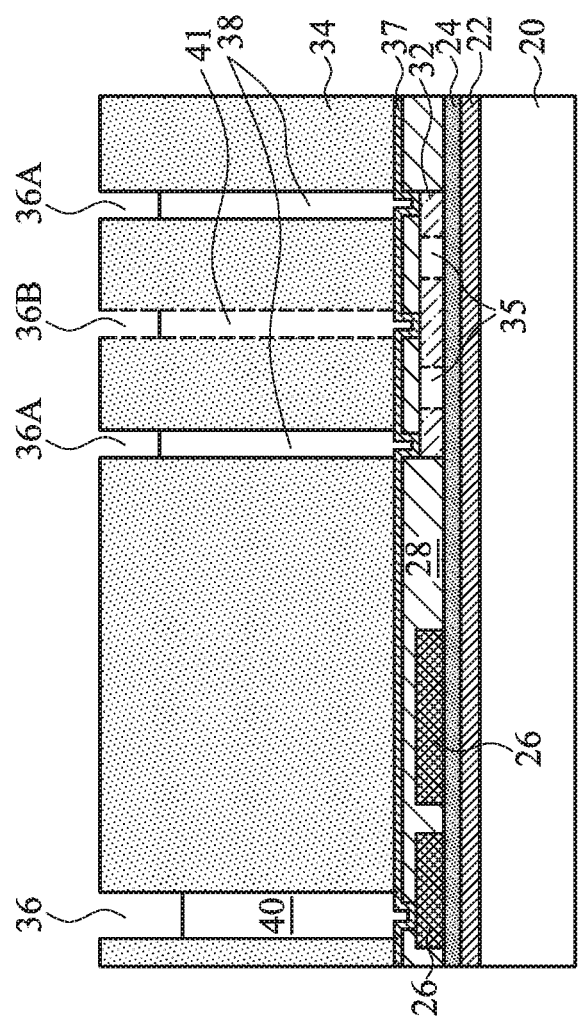

As shown in FIG. 6, metal features 38, 40, and 41 (referred to collectively as 38/40/41 hereinafter) are formed. The respective step is shown as step 308 in the process shown in FIG. 35. Metal features 38/40/41 are formed in openings 36 through plating, which may be electro plating or electro-less plating. Metal features 38/40/41 are plated on the exposed portions of seed layer 37. Metal features 38/40/41 may include copper, aluminum, tungsten, nickel, or alloys thereof. Metal features 40 are referred to as through-vias 40 hereinafter. The top-view shapes of through-vias 40 include, and are not limited to, rectangles, squares, circles, and the like. The material of seed layer 37 may be the same or different from the overlying metal features 38/40/41, and may be the same or different from the underlying metal plate 32.

Figure 7:
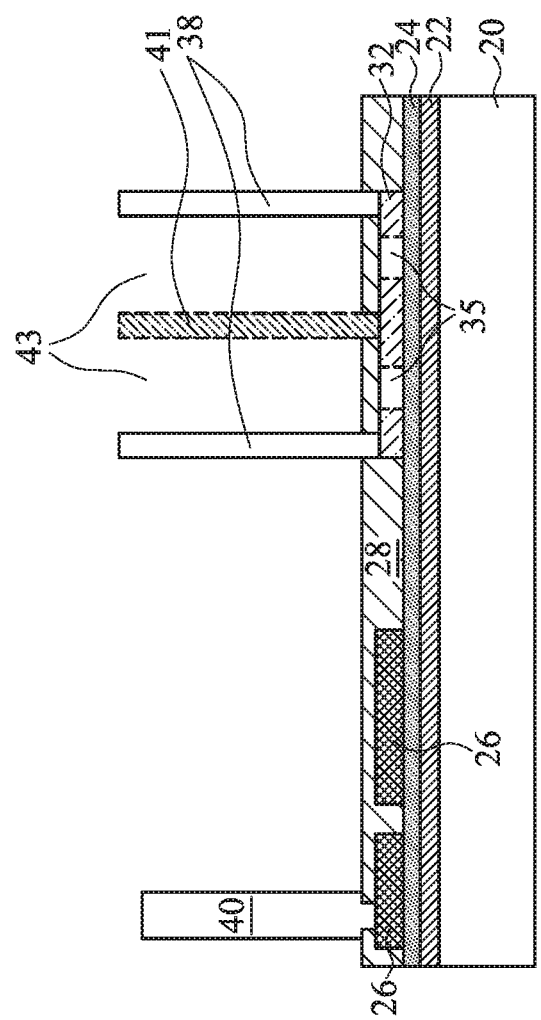

After the plating of metal features 38/40/41, photo resist 34 is removed. An etch step is then performed to remove the exposed portions of seed layer 37, wherein the etching may be an anisotropic or an isotropic etching. The portions of seed layer 37 that are overlapped by metal features 38/40/41, on the other hand, remain not etched. The resulting structure is shown in FIG. 7. The remaining portions of seed layer 37 are not shown in FIG. 7 since they become the integrated portions of metal features 38/40/41. In accordance with some embodiments, in which seed layer 37 is formed of a material similar to or the same as that of the respective overlying metal features 38/40/41, seed layer 37 may be merged with the overlying portions of metal features 38/40/41 with no distinguishable interface therebetween. In accordance with alternative embodiments, there exist distinguishable interfaces between seed layer 37 and the overlying portions of metal features 38/40/41.

As shown in FIG. 7 (also refer to FIGS. 22A and 22B), metal feature 38 forms a full ring (when viewed from top) fully encircling space 43. Metal features 41 may be discrete metal posts in space 43.

Figure 8:
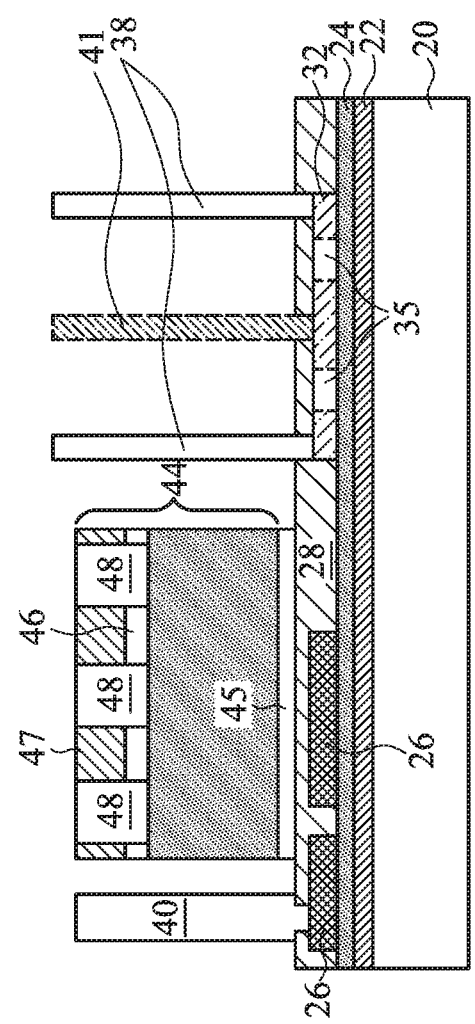

FIG. 8 illustrates the placement of device die 44. The respective step is shown as step 30 in the process shown in FIG. 35. Device die 44 is adhered to dielectric layer 28 through Die-Attach Film (DAF) 45, which is an adhesive film. Device die 44 may be a logic device die including logic transistors therein. In accordance with some exemplary embodiments, device die 44 is designed for mobile applications, and may be a Power Management Integrated Circuit (PMIC) die, a Transceiver (TRX) die, or the like. Although one device die 44 is illustrated, more device dies may be placed over dielectric layer 28.

In accordance with some exemplary embodiments, metal pillar(s) 48 (such as copper posts) are pre-formed as the topmost portion of device die 44, wherein metal pillars 48 are electrically coupled to the integrated circuit devices such as transistors (not shown) in device die 44. In accordance with some embodiments of the present disclosure, a polymer fills the gaps between neighboring metal pillars 48 to form top dielectric layer 47, wherein top dielectric layer 47 may also be on the top of and contact passivation layer 46. Polymer layer 47 may be formed of PBO in accordance with some embodiments. Passivation layer 46 may include silicon nitride, silicon oxynitride, silicon oxide, or multi-layers thereof.

Figure 9:
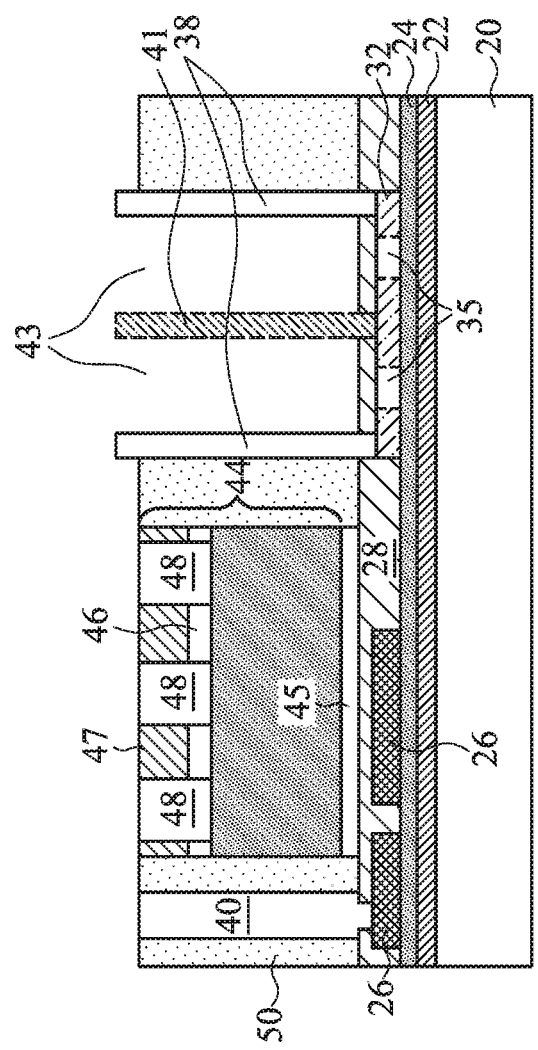

Next, as shown in FIG. 9, encapsulating material 50 is encapsulated (molded) on device die 44. The respective step is shown as step 312 in the process shown in FIG. 35. Encapsulating material 50 fills the gaps between neighboring metal features 38/40/41 and the gaps between metal features 38/40/41 and device die 44. Encapsulating material 50 may include a molding compound, a molding underfill, an epoxy, or a resin. The encapsulation may be performed through transfer molding, wherein a top mold and a release film (not shown) cover device die 44 and metal features 38/40/41 during the molding. Since space/void 43 is fully encircled by metal feature 38, and is covered by the release film, encapsulating material 50 does not fill space/void 43.

Figure 10:
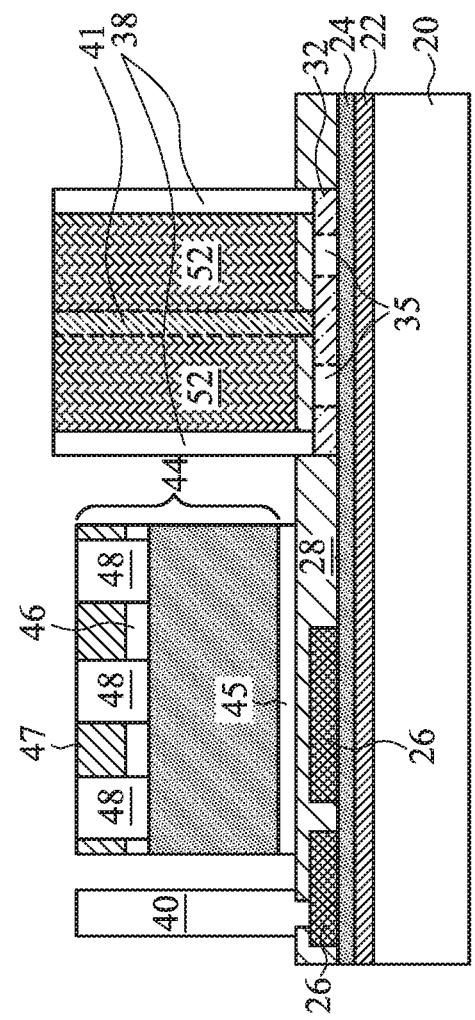

A low-loss dielectric material 52 is then filled into space/void 43, resulting in the structure shown in FIG. 10. The respective step is shown as step 314 in the process shown in FIG. 35. The low-loss dielectric material 52 may have a loss tangent lower than about 0.01 when the respective antenna or waveguide is operated at a high frequency, which may be higher than about 50 GHz. In accordance with some exemplary embodiments, the low-loss dielectric material 52 includes BCB or polyimide. When openings 35 are formed, low-loss dielectric material 52 also includes some portions filling openings 35, which portions are also in contact with the top surface of dielectric layer 28.

Figure 11:
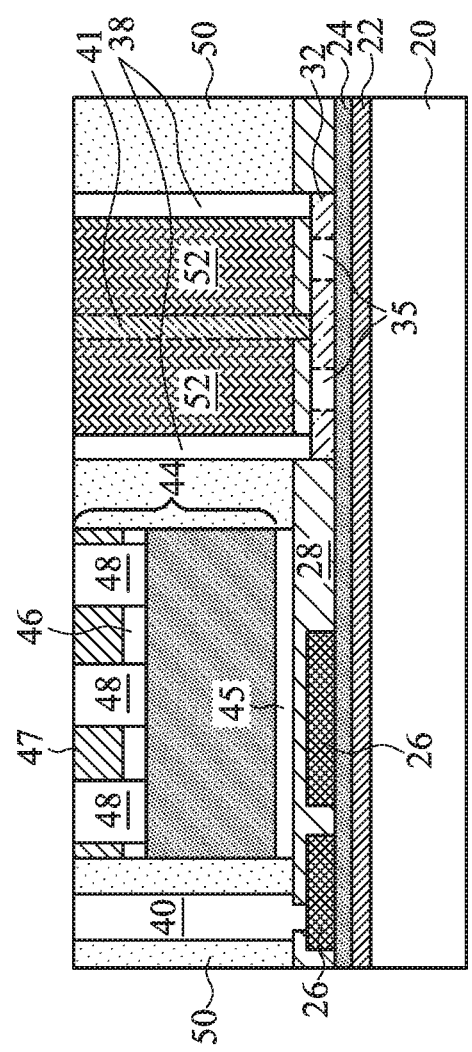

Next, a planarization such as a Chemical Mechanical Polish (CMP) step is performed to level the top surfaces of encapsulating material 50, metal features 38/40/41, and dielectric material 52 with each other. The respective step is shown as step 316 in the process shown in FIG. 35. The resulting structure is shown in FIG. 11. The formation of dielectric material 52 may include dispensing and curing or other methods, depending on the property of dielectric material 52.

Figure 12:
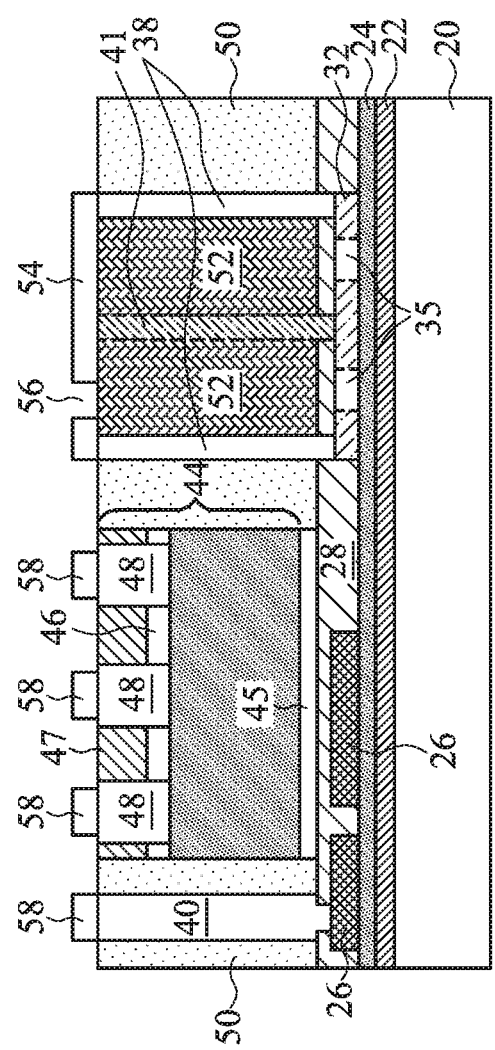

In a subsequent step, as shown in FIG. 12, metal plate 54 is formed on the top surfaces of metal feature 40 and dielectric material 52. The respective step is shown as step 318 in the process shown in FIG. 35. The material and the formation of metal plate 54 may be similar to that are used for forming metal plate 32. Opening 56 is formed in metal plate 54, and dielectric material 52 is exposed through opening 56. In accordance with some exemplary embodiments, when metal plate 54 is formed, metal pads 58 are simultaneously formed over and contacting through-vias 40 and metal pillars 48. In accordance with alternative embodiments, metal pads 58 are not form when metal plate 54 is formed.

Figure 13:
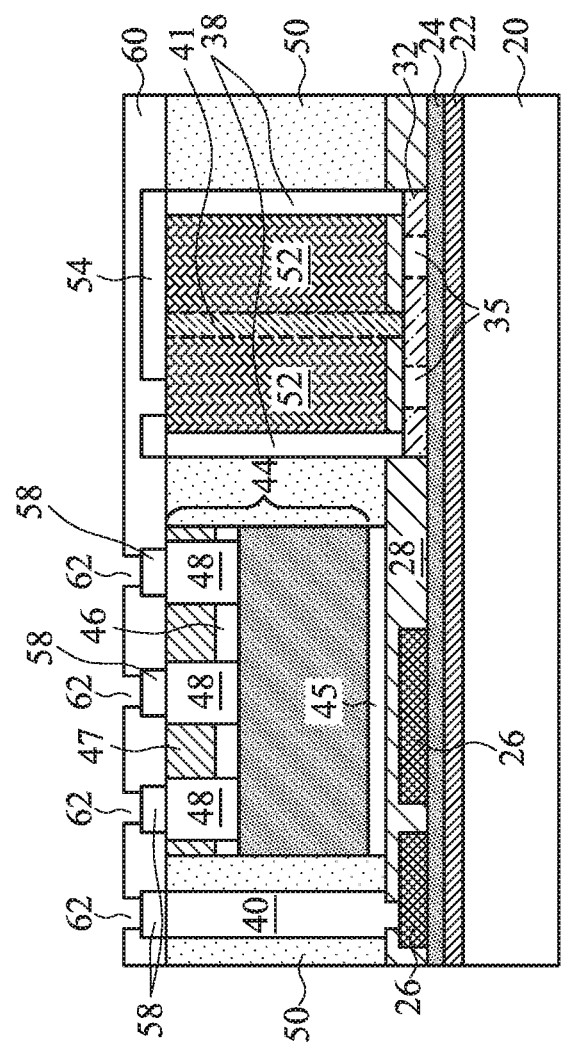

Referring to FIG. 13, dielectric layer 60 is formed. In accordance with some embodiments of the present disclosure, dielectric layer 60 is formed of a polymer such as PBO, polyimide, or the like. In accordance with alternative embodiments, dielectric layer 60 is formed of an inorganic material such as silicon nitride, silicon oxide, or the like. Openings 62 are formed in dielectric layer 60 to expose metal pads 58. The formation of openings 62 may be performed through a photo lithography process.

Figure 14:
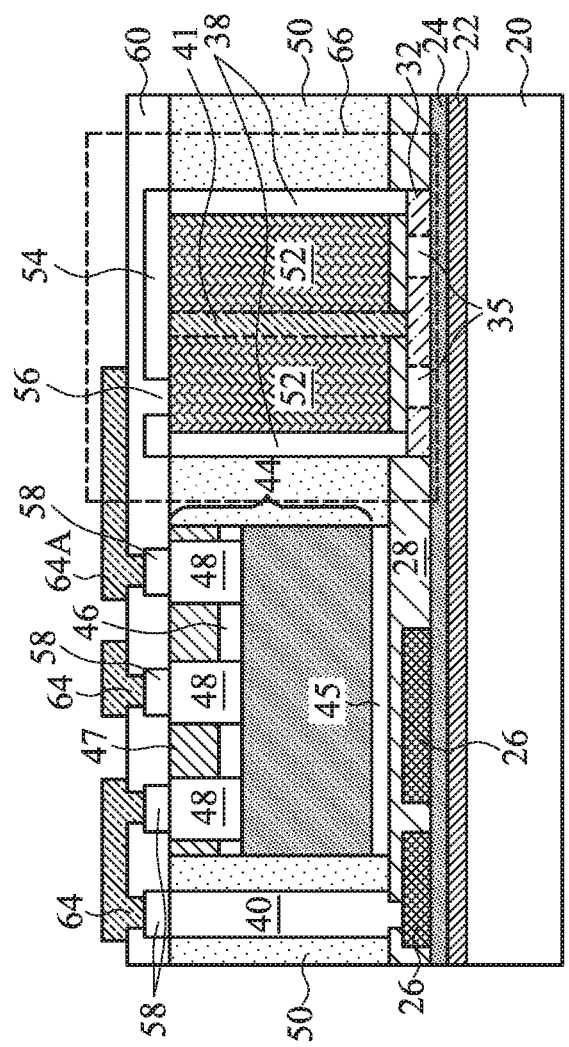

Next, referring to FIG. 14, Redistribution Lines (RDLs) 64 (which also include 64A) are formed to connect to metal pillars 48 and through-vias 40. The respective step is shown as step 320 in the process shown in FIG. 35. RDLs 64 may also electrically interconnect metal pillars 48 and through-vias 40. RDLs 64 include metal traces (metal lines) over dielectric layer 60 as well as vias extending into openings 62 (FIG. 13) to electrically connect to through-vias 40 and metal pillars 48. In accordance with some embodiments of the present disclosure, RDLs 64 are formed in a plating process, wherein each of RDLs 64 includes a seed layer (not shown) and a plated metallic material over the seed layer. The seed layer and the plated material may include the same material or different materials. RDLs 64 may include a metal or a metal alloy including aluminum, copper, tungsten, or alloys thereof.

RDLs 64 includes signal-coupling line 64A, which extends directly over opening 56 of metal plate 54. Metal features 32, 38, and 54 and dielectric material 52 in combination form antenna 66, which is used for generating a high-frequency signal having the frequency higher than 1 GHz, for example. Antenna 66 may be electrically grounded through one of RDLs 26 or 64, wherein the grounding connection is not illustrated. Alternatively, antenna 66 is not grounded. Depending on the dimensions and the material of antenna 66, the frequency may be higher than 50 GHz or higher. Signal-coupling line 64A couples the high-frequency signal in antenna 66 out of antenna 66. In accordance with some exemplary embodiments as shown in FIG. 14, signal-coupling line 64A couples the high-frequency signal to device die 44.

Figure 15:
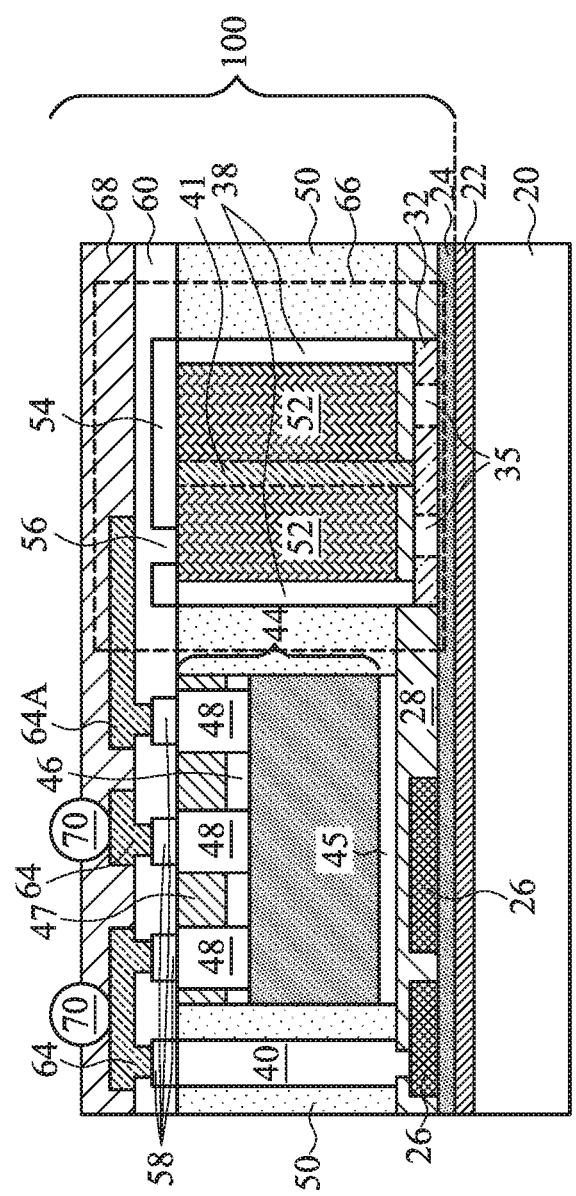

Referring to FIG. 15, dielectric layer 68 is formed over RDLs 64 and dielectric layer 60. Dielectric layer 68 may be formed using a polymer, which may be selected from the same candidate materials as those for forming dielectric layer 60. For example, dielectric layers 68 may include PBO, polyimide, BCB, or the like.

FIG. 15 also illustrates the formation of electrical connectors 70 that are electrically coupled to RDLs 64. The respective step is shown as step 322 in the process shown in FIG. 35. Electrical connectors 70 may include Under-Bump Metallurgies (UBMs, not shown) and solder regions in accordance with some exemplary embodiments. The formation of the UBMs may include deposition and patterning. Solder balls may be placed on the UBMs, and are then reflowed. In accordance with alternative embodiments, the formation of electrical connectors 70 includes performing a plating step to form solder regions over RDLs 64 and then reflowing the solder regions. Electrical connectors 70 may also include metal pillars, and possibly solder caps, which may also be formed through plating. Throughout the description, the combined structure including device die 44, antenna 66, through-vias 40, encapsulating material 50, and the corresponding RDLs and dielectric layers on the upper side and bottom side of encapsulating material 50 is referred to as package 100, which may be a composite wafer with a round top-view shape.

Next, package 100 is de-bonded from carrier 20. Adhesive layer 22 is also cleaned from package 100. The de-bonding may be performed by projecting a light such as UV light or laser on adhesive layer 22 to decompose adhesive layer 22. The resulting structure is shown in FIG. 16. In accordance with some embodiments of the present disclosure, package 100 is further adhered to another carrier (not shown), which is on the opposite side of package 100 than carrier 20, so that electrical connectors 72 may be formed to connect to RDLs 26.

Figure 17:
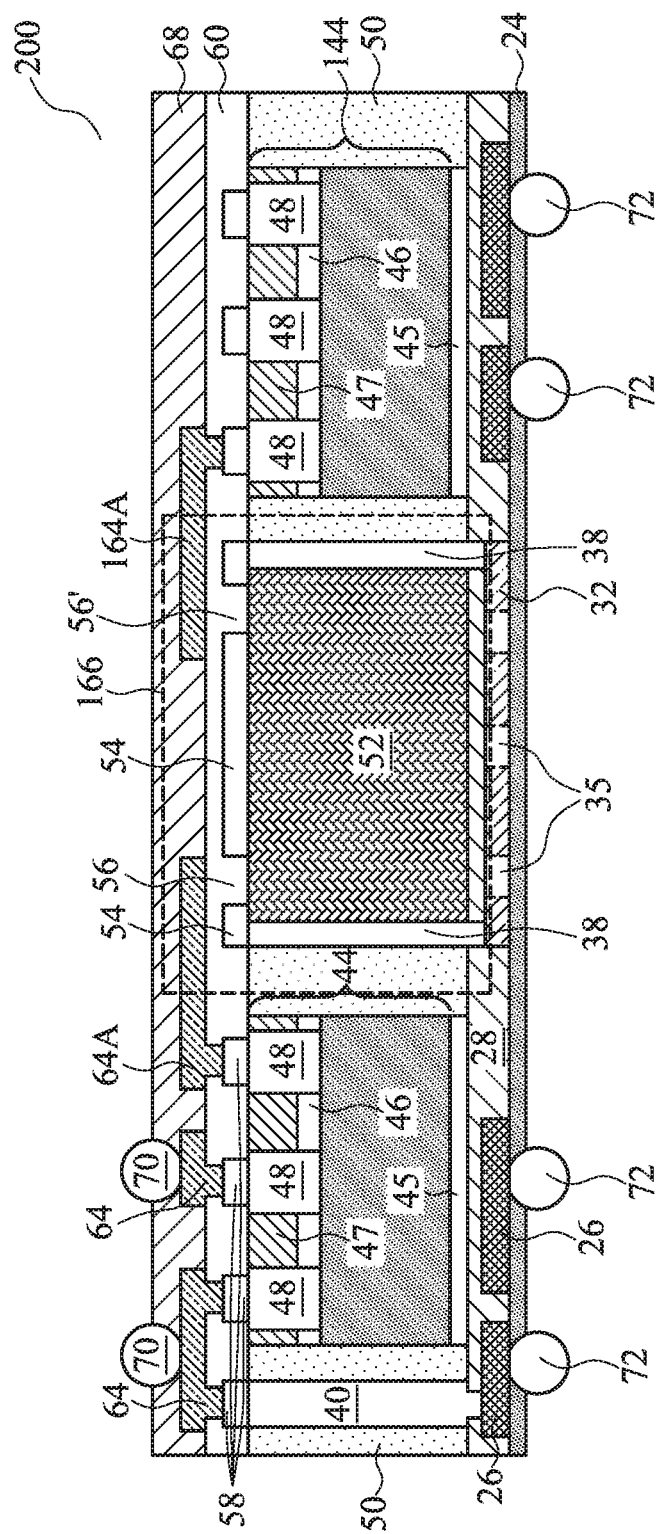
FIG. 17 illustrates the cross-sectional view of a package including a waveguide in accordance with some embodiments.

FIG. 17 illustrates a cross-sectional view of package 200, in which (microwave) waveguide 166 is formed. The formation process may be essentially the same as the formation process shown in FIGS. 1 through 16, excepts the shapes and dimensions of some features are modified. In accordance with some embodiments, metal pad 54 has two openings 56 and 56', each at an end of waveguide 166. Metal traces 64A and 164A extend directly over openings 56 and 56', respectively. Accordingly, metal traces 164 and 164A may be used as a signal input line and a signal output line, respectively. For example, a high-frequency signal may be coupled into waveguide 166 through signal-coupling line 164A, transmitted through waveguide 166, and coupled out to signal-coupling line 64A. Signal-coupling line 164A may be connected to device die 144 in accordance with some embodiments.

Figure 18B:
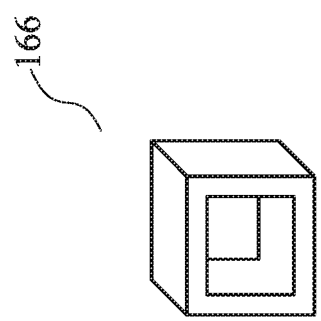
FIGS. 18A and 18B illustrate a perspective view and a middle portion, respectively, of a waveguide in accordance with some embodiments.
Figure 18A:
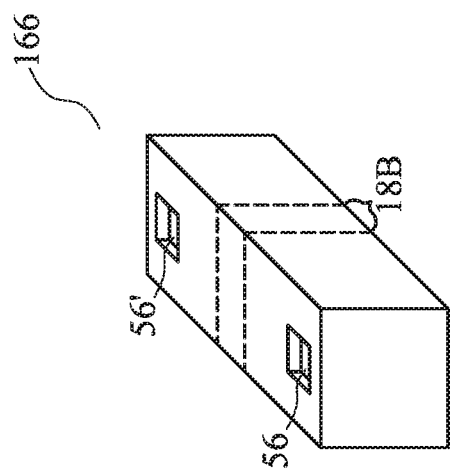

FIG. 18A illustrates a perspective view of waveguide 166 and openings 56 and 56'. The opposite ends of waveguide 166 are blocked by metal. FIG. 18B illustrates a middle portion of waveguide 166, which middle portion is shown as 18B in FIG. 18A.

Figure 19:
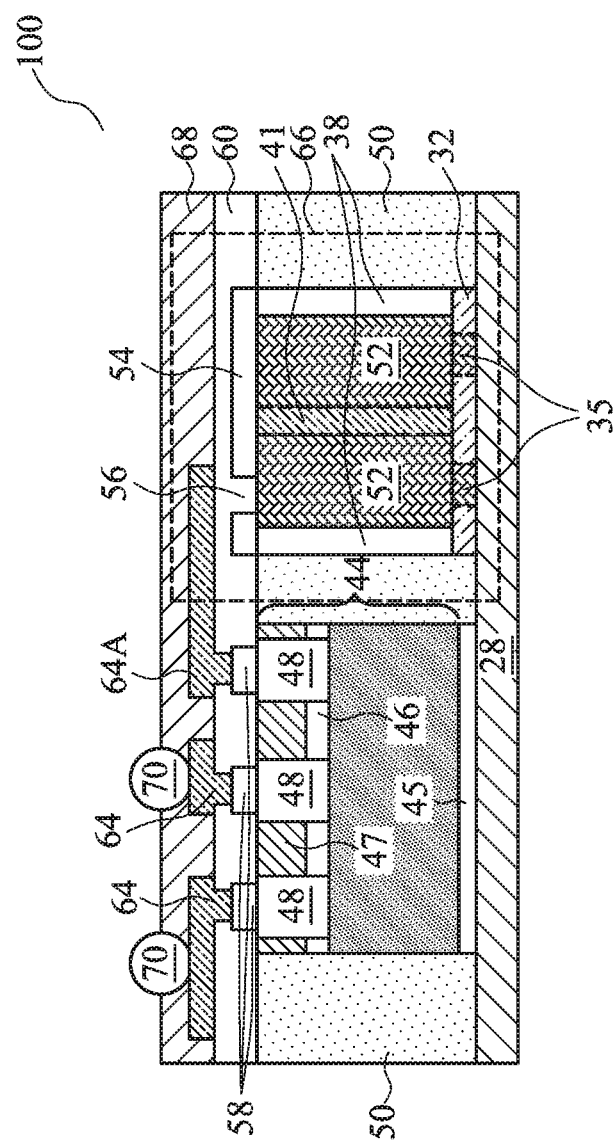
FIG. 19 illustrates the cross-sectional view of a package including an antenna in accordance with some embodiments, wherein no through-via is formed.

FIG. 19 illustrates package 100 in accordance with some embodiments. Package 100 is similar to the package 100 shown in FIG. 16, except no through-vias are formed to connect the conductive features on the top side of package 100 to the bottom side. Accordingly, no conductive features are formed to penetrate through dielectric layer 28 either. The formation of package 100 in accordance with these embodiments may be similar to the process shown in FIGS. 1 through 16, except the steps shown in FIGS. 2, 3, and 16 are skipped.

Figure 20:
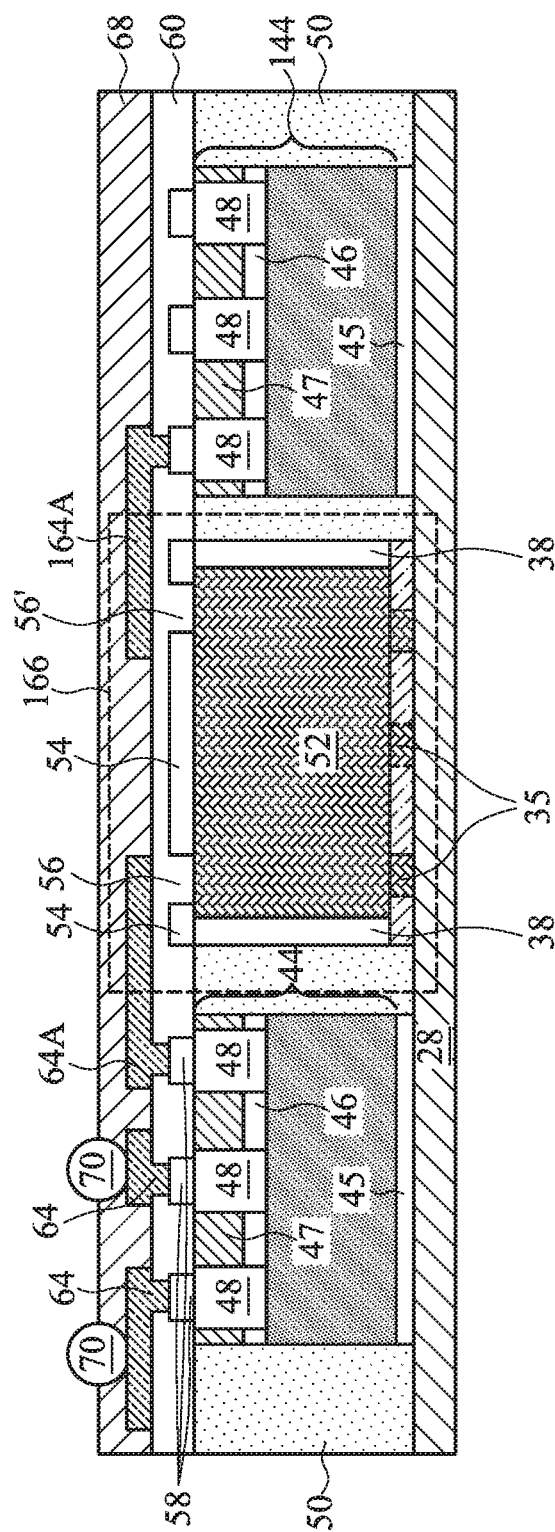
FIG. 20 illustrates the cross-sectional view of a package including a waveguide in accordance with some embodiments, wherein no through-via is formed.

FIG. 20 illustrates package 200 in accordance with alternative embodiments. Package 200 is similar to the package 200 shown in FIG. 17, except no through-vias are formed to connect the conductive features on the top side of package 200 to the bottom side. Accordingly, no conductive features are formed to penetrate through dielectric layer 28 either. The formation process may be appreciated from the teaching provided in the exemplary embodiments of the present disclosure.

Figure 21:
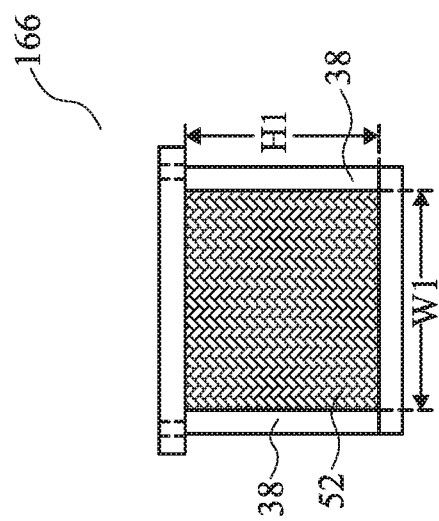
FIG. 21 illustrates a cross-sectional view of a waveguide in accordance with some embodiments.

FIG. 21 illustrates a cross-sectional view of waveguide 166, wherein width W1 and height H1 of the inner space in waveguide 166 are illustrated. Experiment results indicate that when width W1 is 100 μm, and height H1 is 200 μm, signals with frequencies equal to or higher than about 95 GHz may be transferred therein with low loss. For example, when the signal with a frequency of 95 GHz is transferred, the loss is 1.5 db. When the signal with a frequency of 110 GHz is transferred, the loss is 1.0 db. Accordingly, with the low loss, the waveguide 166 in accordance with the embodiments of the present disclosure may meet design specification.

As also shown in FIG. 21, since metal plate 54 is formed in a separate process than the process for forming metal feature/ring 38, the edges of metal plate 54 may extend beyond the outer edges of metal feature/ring 38. Alternatively, the outer edges of metal plate 54, as shown with dashed lines, may be aligned with the outer edges of metal feature/ring 38, or may overlap metal feature/ring 38.

FIG. 22A illustrates a top view of antenna 66. It is shown that metal features 41 are formed as discrete features encircled by dielectric material 52. Signal-coupling line 64A overlaps a middle portion of opening 56, and may extend beyond opening 56. Openings 35 may be formed in metal plate 32, or may not be formed.

FIG. 22B illustrates a top view of waveguide 166. Signal-coupling line 64A overlaps a middle portion of opening 56, and may extend beyond opening 56. Signal-coupling line 164 overlaps a middle portion of opening 56', and may extend beyond opening 56'.

FIGS. 23 through 34 illustrate cross-sectional views of intermediate stages in the formation of an antenna in accordance with some embodiments of the present disclosure. Unless specified otherwise, the materials and the formation methods of the components in these embodiments are essentially the same as the like components, which are denoted by like reference numerals in the embodiments shown in FIGS. 1 through 21 and FIGS. 22A and 22B. The details regarding the formation process and the materials of the components shown in FIGS. 23 through 34 may thus be found in the discussion of the embodiments shown in FIGS. 1 through 21 and FIGS. 22A and 22B, and are not repeated herein.

Figure 23:
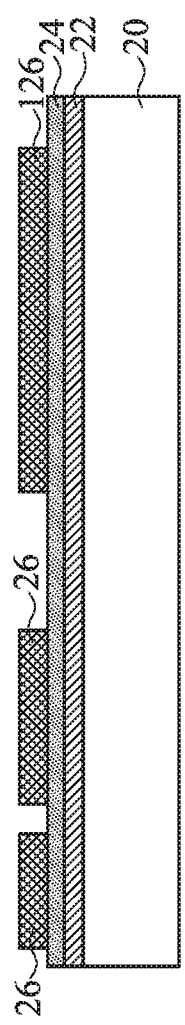
FIGS. 23 through 33 illustrate the cross-sectional views of intermediate stages in the formation of a package including an antenna in accordance with some embodiments.
Figure 24:
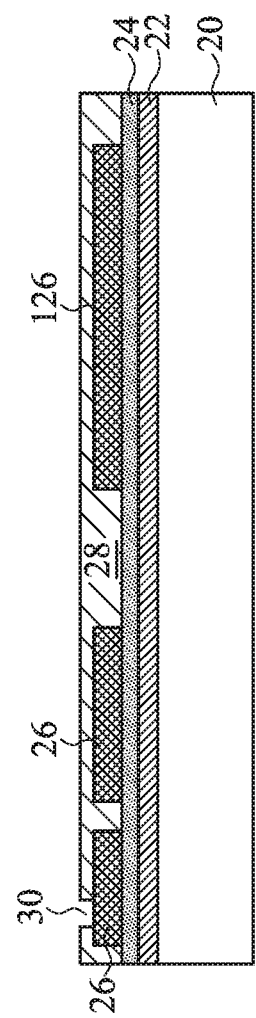

The initial steps of these embodiments are essentially the same as shown in FIG. 1. Next, as shown in FIG. 23, RDLs 26 and metal plate 126 are formed. Dielectric layer 28 is then formed to cover RDLs 26 and metal plate 126, with openings 30 formed in dielectric layer 28 to expose RDLs 26, as shown in FIG. 24.

Figure 25:
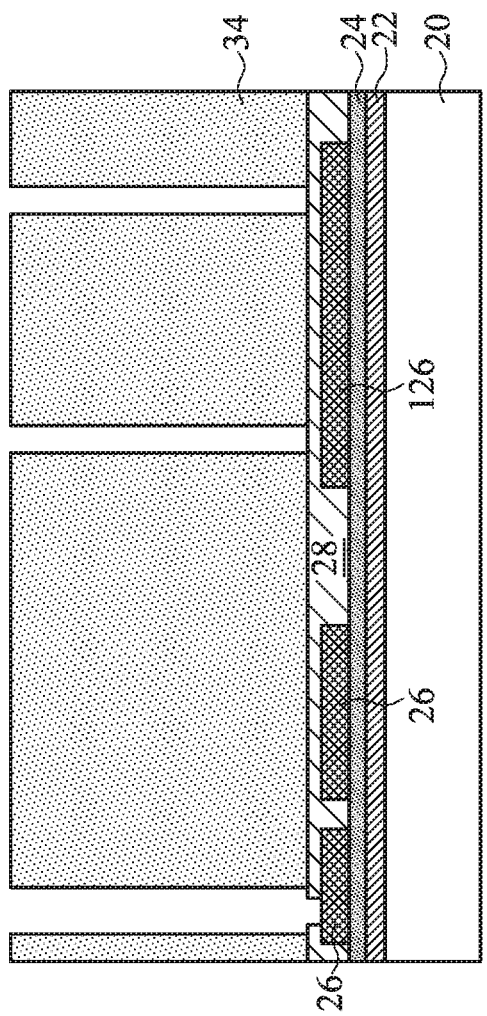
Figure 26:
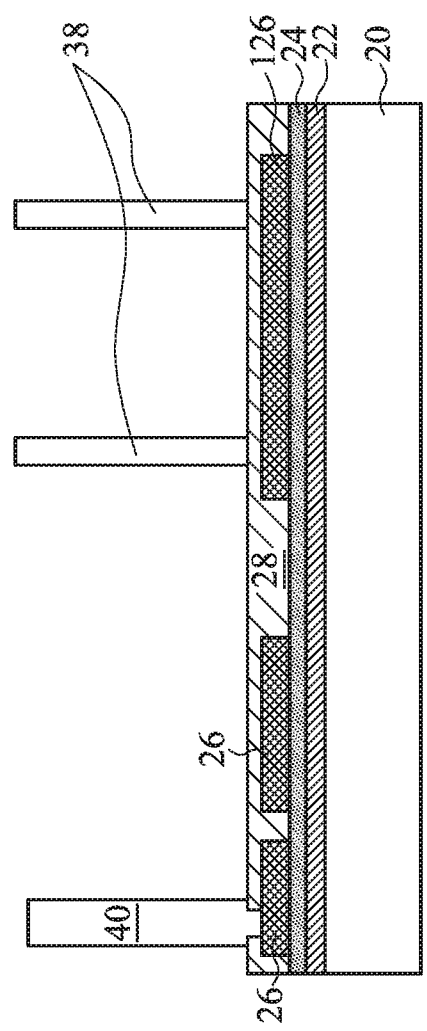

Referring to FIG. 25, in a subsequent step, a seed layer (not shown) is formed, and photo resist 34 is formed and patterned. FIG. 26 illustrates the formation of through-vias 40 and metal features 38 through plating, followed by the removal of photo resist 34 and the exposed seed layer.

Figure 27:
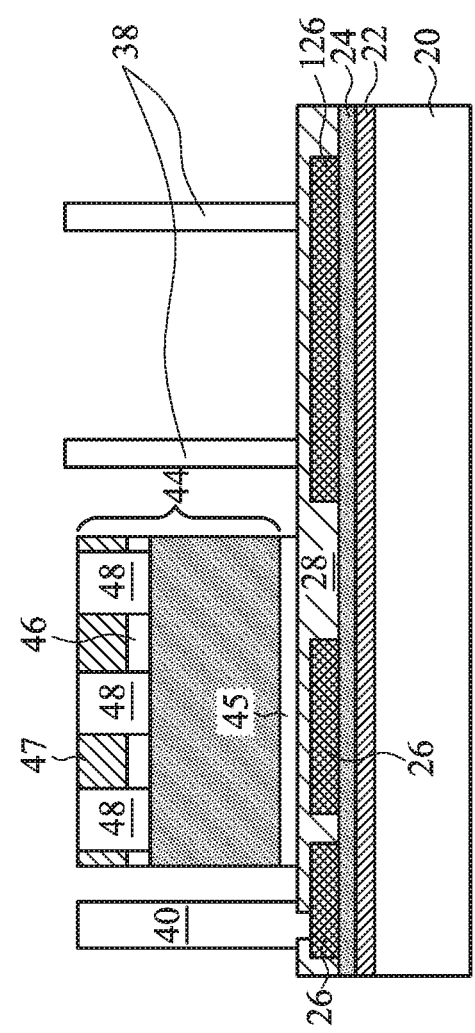
Figure 28:
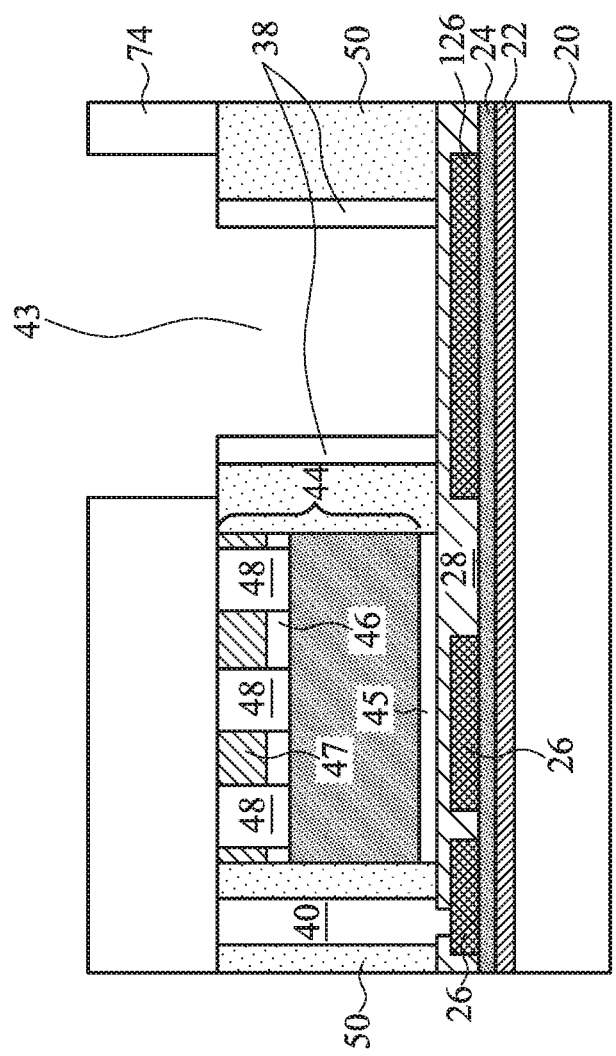

Next, referring to FIG. 27, device die 44 is placed over dielectric layer 28, followed by the dispense and the curing of encapsulating material 50 as shown in FIG. 28. In the resulting structure, metal features 38 are shown as defining space/void 43 therein.

Figure 29:
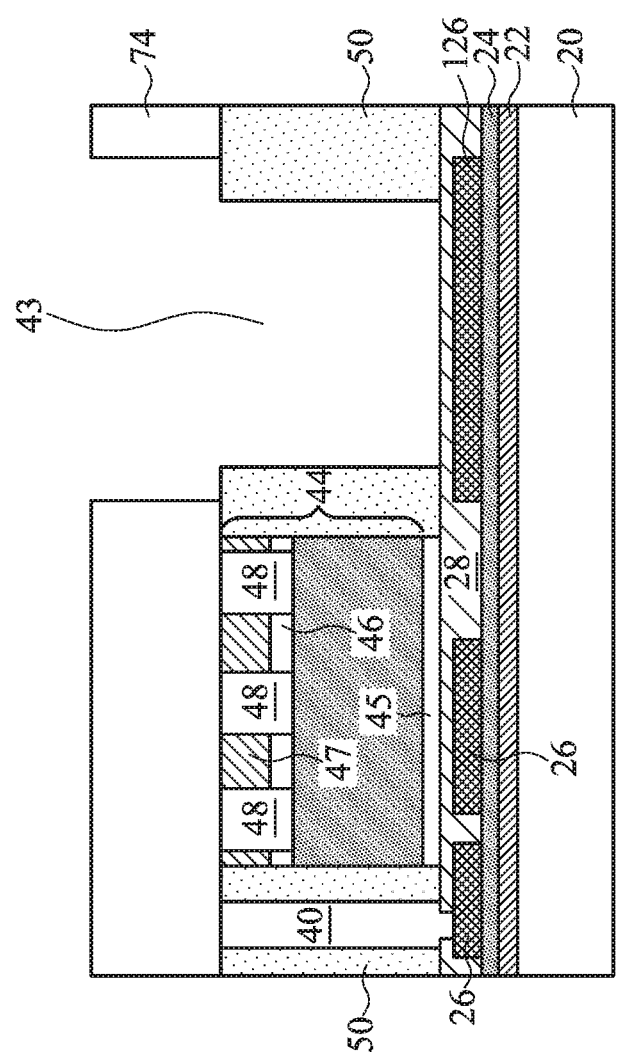

FIG. 28 illustrates the formation and the patterning of photo resist 74, which covers device die 44 and through-vias 40. Metal features 38 are not covered by photo resist 74. Next, metal features 38 as shown in FIG. 28 are etched, and space 43 is expanded, as shown in FIG. 29. The etching may be performed using wet etch or dry etch. Photo resist 74 is then etched.

Figure 30:
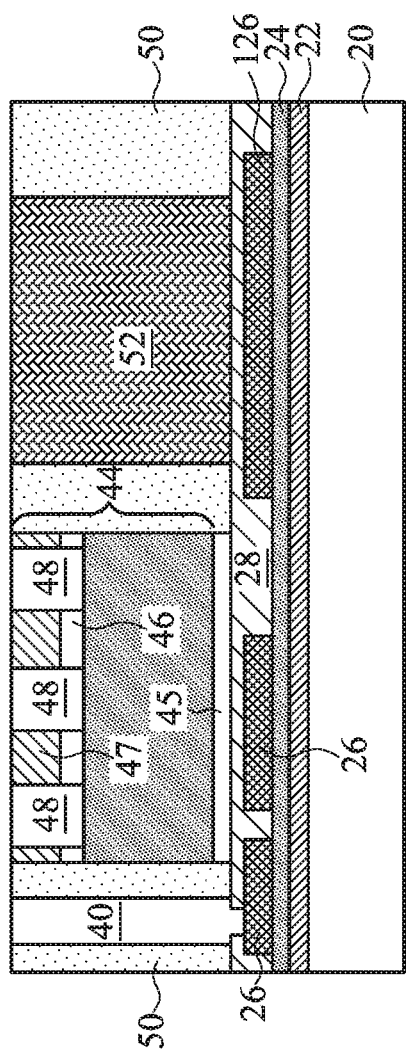

FIG. 30 illustrates the filling of dielectric material 52 into space 43, followed by a planarization step in accordance with some embodiments. The top surface of dielectric material 52 is thus leveled with the top surfaces of through-vias 40 and device die 44. In accordance with some embodiments, dielectric material 52 comprises BCB, Polytetrafluoroethylene (PTFE) (also known as Teflon (a registered trademark of DuPont Inc.)), an aromatic polymer, or the like.

Figure 31:
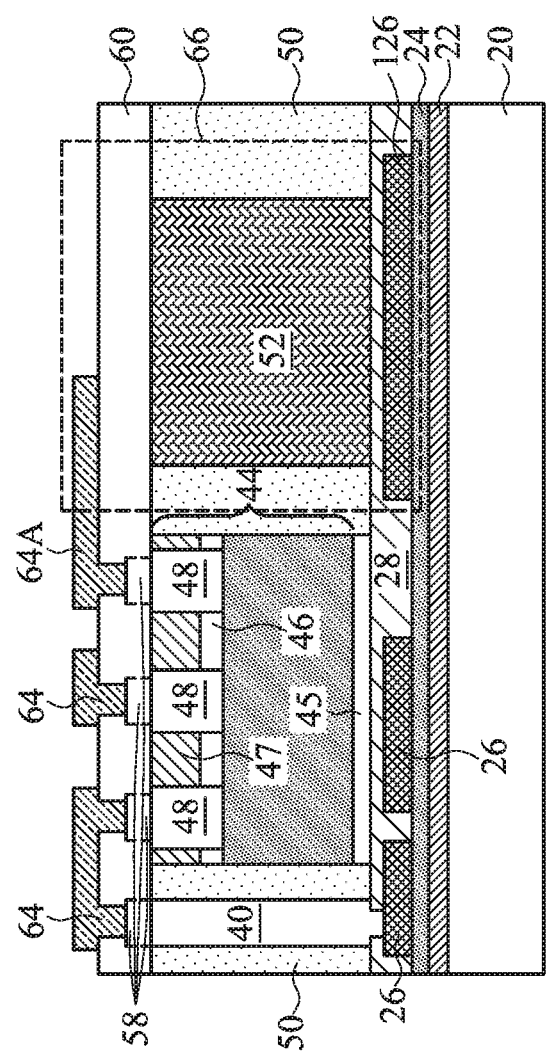

Referring to FIG. 31, dielectric layer 60 and RDLs 64 are formed. RDLs 64 include 64A that extends directly over dielectric region 52. Metal pads 58 may be, or may not be, formed. Accordingly, Metal pads 58 are illustrated using dashed lines. When metal pads 58 are not formed, RDLs 64 are in physical contact with through-vias 40 and metal pillars 48.

Dielectric region 52 and the underlying metal pad 126 in combination form antenna 66. Metal pad 126 may be grounded (wherein the grounding connection is not illustrated). Metal trace 64A, which is a part of RDLs 64, acts as a signal-coupling line that couples the high-frequency signal generated in antenna 66 to device die 44.

Figure 32:
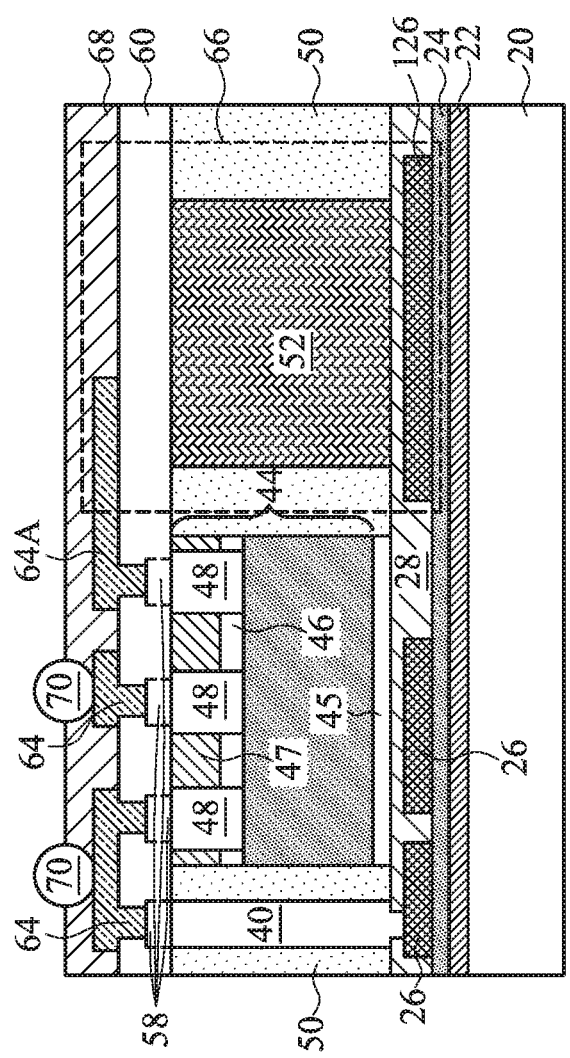
Figure 33:
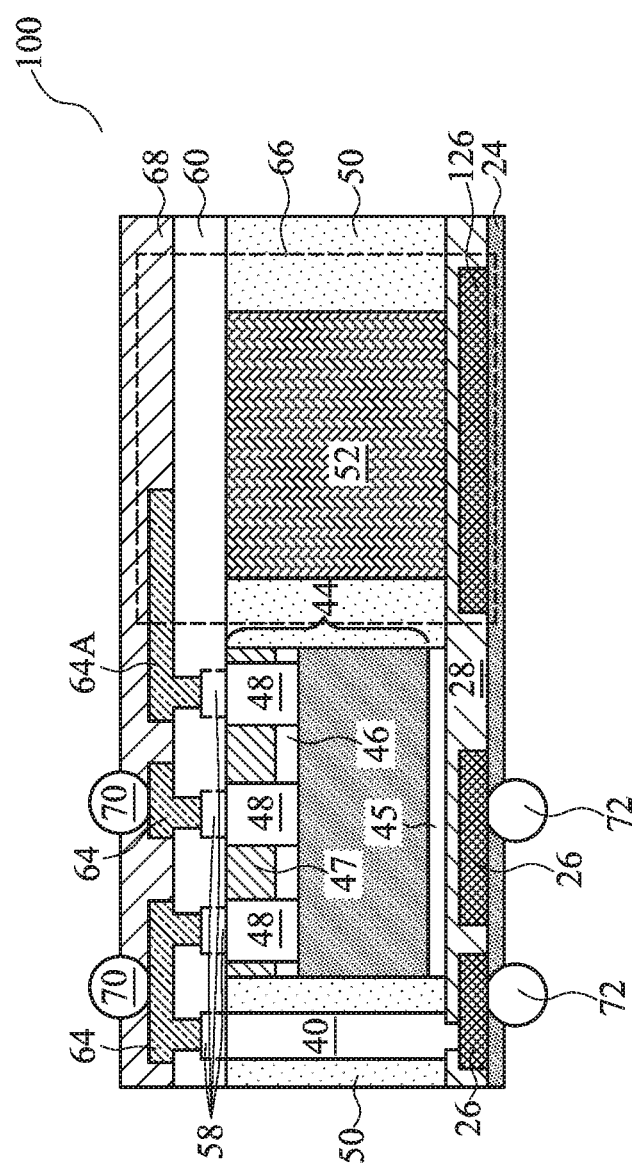

FIG. 32 illustrates the formation of dielectric layer 68 and electrical connector 70, and FIG. 33 illustrates the formation of electrical connectors 72 connected to RDLs 26. The formation of package 100 is thus finished.

Figure 34:
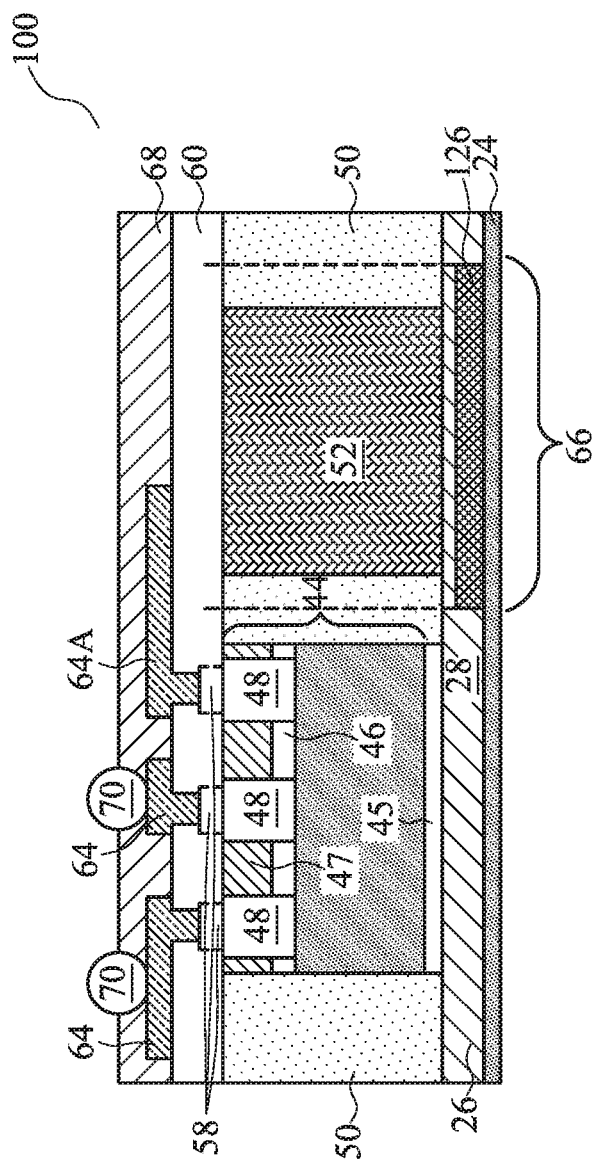
FIG. 34 illustrates the cross-sectional view of a package including an antenna in accordance with some embodiments, wherein no through-via is formed.

FIG. 34 illustrates package 100 in accordance with some embodiments, wherein no through-vias are formed to connect the conductive features on the top side of package 100 to the bottom side. The formation process may be appreciated by one of ordinary skill in the art with the teaching provided in the embodiments.

The embodiments of the present disclosure have some advantageous features. Passive devices such as antennas and waveguides are formed using processes compatible with the InFO process, and very few extra steps are added in order to form the antennas and waveguides. The operating frequency range and the loss of these devices meet the specification of the devices.

In accordance with some embodiments of the present disclosure, a method includes forming a first metal plate, forming a metal ring aligned to peripheral regions of the first metal plate, and placing a device die level with the metal ring, encapsulating the device die and the metal ring in an encapsulating material. The method further includes filling a dielectric material into a space encircled by the metal ring, and forming a second metal plate covering the dielectric material and the metal ring, with an opening formed in the second metal plate. A plurality of redistribution lines is formed, with one of the redistribution lines overlapping a portion of the opening. The first metal plate, the metal ring, the second metal plate, and the dielectric material in combination form an antenna or a waveguide. The redistribution line forms a signal-coupling line of the passive device.

In accordance with some embodiments of the present disclosure, a method includes forming a first dielectric layer, forming a first metal plate over the first dielectric layer, forming a metal ring aligned to edges of the first metal plate, placing a device die leveled with the metal ring, encapsulating the device die and the metal ring in an encapsulating material, and etching the metal ring to form a void in the encapsulating material. A dielectric material is filled into the void. A second dielectric layer is formed over the dielectric material, the device die, and the encapsulating material. A plurality of redistribution lines is then formed, and includes a first redistribution line overlapping a portion of the dielectric material. The first redistribution line is spaced apart from the dielectric material by the second dielectric layer. The dielectric material forms an antenna, and the first redistribution line forms a signal-coupling line of the antenna. The plurality of redistribution lines further includes a second redistribution line extending into the second dielectric layer to electrically couple to the device die.

In accordance with some embodiments of the present disclosure, a package includes a passive device selected from the group consisting of an antenna and a waveguide. The passive device includes a first metal plate, a metal ring aligned to peripheral regions of the first metal plate, a dielectric material encircled by the metal ring, with a bottom surface of the dielectric material contacting a top surface of the first metal plate, and a second metal plate overlapping the dielectric material and the metal ring, with a first opening formed in the second metal plate. A device die is leveled with the passive device. An encapsulating material encapsulates the device die and the passive device therein. A dielectric layer overlies the device die, the passive device, and the encapsulating material. A plurality of redistribution lines includes a first redistribution line overlapping a portion of the first opening. The first redistribution line is spaced apart from the second metal plate by the first dielectric layer. The plurality of redistribution lines further includes a second redistribution line extending into the first dielectric layer to electrically couple to the device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a passive device comprising:
   a first metal plate;
   a metal ring aligned to peripheral regions of the first metal plate;
   a dielectric block encircled by the metal ring, with a bottom surface of the dielectric block contacting a top surface of the first metal plate; and
   a second metal plate overlapping the dielectric block and the metal ring;
   a device die leveled with the passive device;
   an encapsulating material encapsulating the device die and the passive device therein;
   a first dielectric layer over the device die, the passive device, and the encapsulating material, wherein the first dielectric layer comprises a first bottom portion extending into the second metal plate to contact the dielectric block; and
   a first plurality of redistribution lines comprising a redistribution line overlapping the first bottom portion of the first dielectric layer, wherein the redistribution line is spaced apart from the second metal plate by the first dielectric layer, and the redistribution line extends into the first dielectric layer to electrically couple to the device die.

2. The package of claim 1, wherein the passive device comprises an antenna.

3. The package of claim 2, wherein the antenna is configured to receive a signal with a frequency higher than about 50 GHz.

4. The package of claim 1, wherein the passive device comprises a waveguide.

5. The package of claim 4, wherein the waveguide is configured to transmit a signal with a frequency higher than about 50 GHz.

6. The package of claim 4, wherein the first dielectric layer comprises a second bottom portion extending into the second metal plate to contact the dielectric block, and the first plurality of redistribution lines comprises a third redistribution line overlapping the second bottom portion of the first dielectric layer.

7. The package of claim 1 further comprising;
   a second plurality of redistribution lines underlying the device die and the encapsulating material; and
   a through-via penetrating through the encapsulating material, wherein the through-via electrically couples one of the first plurality of redistribution lines to one of the second plurality of redistribution lines.

8. The package of claim 1, wherein the dielectric block has a loss tangent lower than about 0.01.

9. A package comprising:
   a molding compound;
   a dielectric block encircled by the molding compound;
   an insulation layer over and contacting the dielectric block and the molding compound;
   a signal coupling line over the insulation layer, wherein an end portion of the signal coupling line overlaps a portion of the dielectric block; and
   a device die encapsulated in the molding compound, wherein the signal coupling line is electrically coupled to the device die.

10. The package of claim 9, wherein the end portion of the signal coupling line terminates in a region directly over the dielectric block.

11. The package of claim 9 further comprising:
    a metal ring between, and in contact with, both the dielectric block and the molding compound.

12. The package of claim 11 further comprising:
    a first metal plate having a top surface in contact with a bottom surface of the metal ring.

13. The package of claim 12 further comprising:
    a dielectric layer underlying a portion of the first metal plate, wherein a portion of the first metal plate extends into the dielectric layer.

14. The package of claim 9 further comprising:
    a second metal plate over and contacting the dielectric block, wherein the end portion of the signal coupling line overlaps an opening in the second metal plate.

15. The package of claim 9 further comprising:
a third metal plate overlapped by the dielectric block; and
an insulating layer separating the third metal plate from the third metal plate.

16. A package comprising:
a first dielectric layer;
a first metal plate in the first dielectric layer;
a metal ring over the first metal plate, wherein the metal ring has a bottom surface in contact with top surfaces of peripheral regions of the first metal plate;
a second metal plate over the metal ring, wherein the metal ring has a top surface in contact with bottom surfaces of peripheral regions of the second metal plate; and
a second dielectric layer comprising:
  a first portion overlapping the second metal plate; and
  a second portion extending into the second metal plate.

17. The package of claim 16 further comprising:
a dielectric block encircled by the metal ring; and
an encapsulating material encapsulating the metal ring therein, wherein the second portion of the second dielectric layer contacts the dielectric block.

18. The package of claim 16 further comprising:
a signal coupling line comprising an end portion overlapping the second portion of the second dielectric layer; and
a device die, wherein the signal coupling line is electrically coupled to the device die.

19. The package of claim 16, wherein the first dielectric layer comprises an additional portion extending into the first metal plate.

20. The package of claim 16 further comprising a discrete metal post in the metal ring.

* * * * *